United States Patent
Shen et al.

(10) Patent No.: US 9,171,633 B2
(45) Date of Patent: *Oct. 27, 2015

(54) MEMORY AND SENSE PARAMETER DETERMINATION METHODS

(71) Applicant: MICRON TECHNOLOGY, INC., Boise, ID (US)

(72) Inventors: Zhenlei Shen, Boise, ID (US); William H. Radke, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/570,358

(22) Filed: Dec. 15, 2014

(65) Prior Publication Data

US 2015/0098276 A1    Apr. 9, 2015

Related U.S. Application Data

(63) Continuation of application No. 13/413,130, filed on Mar. 6, 2012, now Pat. No. 8,934,306.

(51) Int. Cl.

| G11C 7/06 | (2006.01) |
|---|---|
| G11C 11/34 | (2006.01) |
| G11C 7/10 | (2006.01) |
| G11C 16/26 | (2006.01) |
| G11C 7/08 | (2006.01) |
| G11C 11/56 | (2006.01) |
| G11C 13/00 | (2006.01) |
| G11C 29/02 | (2006.01) |

(52) U.S. Cl.
CPC ........ *G11C 16/26* (2013.01); *G11C 7/06* (2013.01); *G11C 7/08* (2013.01); *G11C 7/1006* (2013.01); *G11C 11/56* (2013.01); *G11C 11/5642* (2013.01); *G11C 13/004* (2013.01); *G11C 29/026* (2013.01); *G11C 2013/0054* (2013.01); *G11C 2013/0057* (2013.01); *G11C 2207/2254* (2013.01); *G11C 2211/5634* (2013.01)

(58) Field of Classification Search
CPC ............................... G11C 7/1006; G11C 7/06
USPC ........................................ 365/189.07, 185.24
See application file for complete search history.

(56) References Cited

U.S. PATENT DOCUMENTS

| 7,200,066 | B2 | 4/2007 | Krenzke et al. |
|---|---|---|---|
| 7,274,611 | B2 | 9/2007 | Roohparvar |
| 7,817,467 | B2 | 10/2010 | Roohparvar et al. |
| 7,863,876 | B2 | 1/2011 | Cook et al. |
| 7,889,105 | B2 | 2/2011 | Zushi et al. |
| 2009/0282186 | A1* | 11/2009 | Mokhlesi et al. ............. 711/103 |
| 2010/0302850 | A1 | 12/2010 | Kim et al. |

(Continued)

FOREIGN PATENT DOCUMENTS

| DE | 102004003357 | 12/2004 |
|---|---|---|
| JP | 2013122804 | 6/2013 |

*Primary Examiner* — Hoai V Ho
*Assistant Examiner* — Tri Hoang
(74) *Attorney, Agent, or Firm* — Dicke, Billig & Czaja, PLLC

(57) ABSTRACT

Memory devices and methods for operating a memory include filtering a histogram of sensed data of the memory, and adjusting a parameter used to sense the memory using the filtered histogram. Filtering can be accomplished by averaging or summing, and may include weighting the sums or averages.

20 Claims, 4 Drawing Sheets

(56) References Cited

U.S. PATENT DOCUMENTS

| | | | |
|---|---|---|---|
| 2011/0007563 A1* | 1/2011 | Yoo et al. | 365/185.03 |
| 2011/0194348 A1 | 8/2011 | Mokhlesi et al. | |
| 2011/0280084 A1 | 11/2011 | Radke et al. | |
| 2012/0182810 A1 | 7/2012 | Radke et al. | |
| 2012/0240011 A1 | 9/2012 | Helm et al. | |
| 2012/0262991 A1 | 10/2012 | Ghilardelli | |

* cited by examiner

MEMORY AND SENSE PARAMETER DETERMINATION METHODS

RELATED APPLICATION

This application is a continuation of U.S. application Ser. No. 13/413,130, titled "MEMORY AND SENSE PARAMETER DETERMINATION METHODS," filed Mar. 6, 2012 and issued as U.S. Pat. No. 8,934,306 on Jan. 13, 2015, which is commonly assigned and incorporated entirely herein by reference.

FIELD

The present disclosure relates generally to memories, and in particular, in one or more embodiments, the present disclosure relates to determination of a sense parameter in flash memories.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming of charge storage structures (e.g., floating gates or charge traps) or other physical phenomena (e.g., phase change or polarization), determine the data value of each cell. The cells are usually grouped into blocks. Each of the cells within a block can be electrically programmed, such as by charging the charge storage structure. The data in a cell of this type is determined by the presence or absence of the charge in the charge storage structure. The charge can be removed from the charge storage structure by an erase operation. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a logical column of memory cells is coupled in parallel with each memory cell coupled to a data line, such as those typically referred to as bit lines. In NAND flash architecture, a column of memory cells is coupled in series with only the first memory cell of the column coupled to a bit line.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit by using such technologies as multilevel cells (MLC). For example, MLC NAND flash memory is a very cost effective non-volatile memory.

Multilevel cells can take advantage of the analog nature of a traditional flash cell by assigning a bit pattern to a specific threshold voltage (Vt) range stored on the cell. This technology permits the storage of two or more bits per cell, depending on the quantity of voltage ranges assigned to the cell and the stability of the assigned voltage ranges during the lifetime operation of the memory cell.

For example, a cell may be assigned four different voltage ranges of 200 mV for each range. Typically, a safety range of 0.2V to 0.4V is between each range to keep the ranges from overlapping. If the voltage stored on the cell is within the first range, the cell is in a first data state (representing, e.g., a logical 11), which is typically considered the erased state of the cell. If the voltage is within the second range, the cell is in a second data state (representing, e.g., a logical 01). This continues for as many ranges that are used for the cell provided these voltage ranges remain stable during the lifetime operation of the memory cell.

Since a MLC cell can be in one of two or more data states, the width of each of the voltage ranges for each state can be very important. The width is related to many variables in the operation of a memory circuit. In order to properly read a particular data state, a sense parameter such as a read voltage level, should be determined for the data state. A read voltage level, for example, can be affected by the width of an actual distribution of memory cells programmed to the corresponding data state within a memory, by threshold voltage noise, fluctuations around a transition point, which might also be referred to as a cross-over point, from one range to another, the width of threshold distributions (i.e., fat tails, that is distributions that extend into an adjacent distribution, e.g., the tail of the distribution is flared out, compared to a Gaussian distribution), and the like.

For reasons such as those stated above, and for other reasons, such as those stated below, which will become apparent to those skilled in the art upon reading and understanding the present specification, there is a need in the art for, among other things, improvements in determining a sense parameter for memories.

DETAILED DESCRIPTION

In the following detailed description of the embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense, and the scope of the present disclosure is defined only by the appended claims, along with the full scope of equivalents to which such claims are entitled.

Determination of a sense parameter, such as a read voltage level, in a histogram of actual data sensed from a memory, a minimum at or about the expected transition threshold voltage between data states of the memory is an indication of a transition point. However, this transition point may be difficult to determine given randomness, noise, and other discussed factors in the data and the distributions themselves. Fluctuations around minimums in the vicinity of a transition between data states may make it difficult to determine a true minimum. The initial read voltage level for a transition between data states in the memory is in one embodiment determined based on the data programmed into the memory. In other words, it is a function of the data. While a particular design may have dead space between adjacent data space (as described in the background), actual sensed data will likely include at least some cells that have a threshold voltage level within the dead space. Otherwise, the matter of a transition point may not immediately make sense since we previously said there was a dead space between data states.

Figure 1:
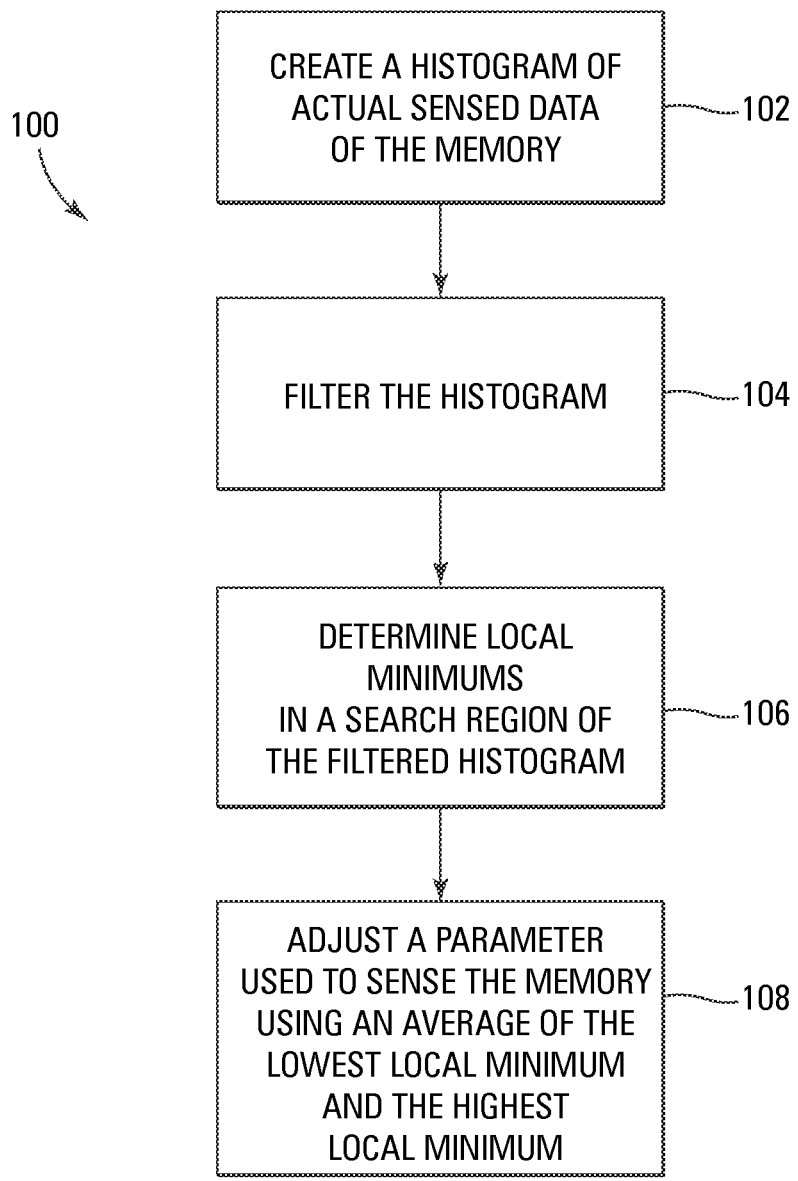
FIG. 1 is a flow chart diagram of a method according to an embodiment of the present disclosure.

A method 100 for operating a memory is shown in flowchart form in FIG. 1. Method 100 comprises creating (e.g., building) a histogram of actual sensed data (e.g., sensed threshold voltage levels) of the memory in block 102, filtering (e.g., smoothing) the histogram in block 104, determining (e.g., finding) local minimums in a search region of the filtered histogram in block 106, and adjusting a parameter (e.g., a read voltage level) used to sense (e.g., read) the memory using an average of the lowest local minimum and the highest local minimum in block 108. Because of the noise inherent in histograms, for example, zig-zags and other anomalies may mislead traditional searching methods looking for minimums that correspond to optimum sense parameters for various data states of a multiple level cell memory. Filtering the histogram, for example, should allow for more reliable searching for optimum sense parameters (e.g., optimum read voltage levels). After parameter adjustment, the adjusted parameter may be used to resense the memory.

Filtering in one embodiment comprises determining, for each threshold voltage in the histogram, an average of the threshold voltage and one or more threshold voltages surrounding the threshold voltage. That is, for each threshold voltage of the histogram, in one embodiment, a filtered histogram plots the average of the threshold voltage and one or more adjacent threshold voltages on each side of the threshold voltage. This filtered histogram allows for the determination of local minimums more reliably than a noisy histogram does. For example, referring to FIG. 2, a partial histogram for a memory device is shown. The dashed lines 202 indicate the original data histogram in a logarithmic scale versus threshold voltage. The solid line 204 represents a filtered histogram using a three-sample average, that is, the threshold voltage and the neighbor threshold voltages for immediately adjacent samples are averaged to plot the filtered histogram 204.

It should be understood that higher numbers of samples may be averaged, such as 5, 7, or more, without departing from the scope of the disclosure. However, as the number of samples increases, the chances for losing locality in the filtered histogram increases.

In operation, after filtering the histogram, local minimums are determined (e.g., identified) as described above. With respect to FIG. 2, three local minimums within a search region of threshold voltages from about of 270 to 310 threshold voltage (Vt) steps appear, at approximately 287 steps, 293 steps and 297 steps, indicated as elements 206, 208, and 210, respectively. Averaging the lowest and highest local minimums from the region (e.g., 287 steps and 297 steps) results in 292 steps. This number of threshold voltage steps is set in one embodiment as the read voltage level R3.

Since the threshold voltage distributions in a memory may have different widths, as has been discussed, the valleys between distributions may be difficult to determine. Minimums in a search region of the filtered histogram may be obtained, in one embodiment, using sigma-weighted mean interpolation. A sigma-weighted mean interpolation in one embodiment is accomplished by initializing a rough valley location from a table or the like based on the data, computing peaks between valleys, computing a distribution width for each level, and calculate valleys with weighted peaks by width. In one embodiment, the process may be refined through multiple iterations.

Filtering the histogram can be accomplished using other or additional functions, such as weighting or summing, as described below. In some situations, such as where a limited number of bits are available for a representation of a filtered histogram, summing the initial read position numbers with the adjacent position numbers can preserve bits. For example, if three samples are used for an average, and the number of cells at the three threshold voltages used are 2, 5, and 3, an average is 3.333. Without being able to represent multiple bits, information contained within the least significant bit or bits can be lost. However, if the number of cells at the three threshold voltages are summed, and the sums plotted, more information may be retained.

Averaging and summing of multiple samples are two different concepts related to filtering as described herein. For example, averaging can be simple averaging or weighted averaging, and summing can be simple summing or weighted summing. Weighting may be used to increase the chances that locality will be preserved. For example, a simple sum or a simple average weights each threshold voltage level equally, including those furthest away from the main read threshold voltage level. For a weighted sum or a weighted average, in one embodiment, weighting comprises weighting immediately adjacent neighbor threshold voltage levels to the threshold voltage level being weighted at a partial amount of a weight of the sample at the threshold voltage level. Weights can be adjusted to be lower the further the neighbor is from the initial read voltage level, in nearly any weighting scheme. Using hardware to weight is accomplished more easily when weights are ¼, ½, and 1, since ½ is simply removal of the LSB, and ¼ is removal of the two LSBs. Higher weights on close neighbors and lower weights on far neighbors leads to a weighted average or a weighted sum. This can reduce problems with losing locality with higher numbers of adjacent samples being used, while still allowing for a smoother histogram.

The adjusted sense parameter can be further modified in one embodiment by applying an offset. This offset can be used to compensate for wider or narrower distributions. For example, in general in four data state flash memories, the distributions for middle data states 1 and 2 are narrower than the distributions for edge data states 0 and 3. Specifically, data state 0 typically will have a long (fat) tail on the distribution, that tail extending into the adjacent data state 1 distribution. So, although clearly defined minimums appear in both raw and filtered histograms, the optimum read voltage level will be offset somewhat from both the initial read voltage level and the adjusted read voltage level when the distributions for the data states on either side of the initial read voltage level have different widths (e.g., tail lengths).

This offset is determinable for a particular device. The offset, for example, can be a function of the distributions. It can be related to the programming process and/or the operating conditions of the flash, due to cycling and the like. In one embodiment, the offset is a table-based per flash adjustment. After testing of the memory, the typical distribution patterns are determined, and the offsets can be determined and stored, for example, in an offset table. The offsets in one embodiment are applied not to the initial read voltage level, but to the adjusted read voltage level. Typically, offsets move the read voltage toward the narrower of two distributions of different sizes, so offsets will usually modify the adjusted read voltage level in a conventional four data state memory toward data state1 from data state0, and toward data state2 from data state3, whereas the offset between data states2 and 3 is typically negligible since the distributions are typically very close to the same width.

Figure 2:
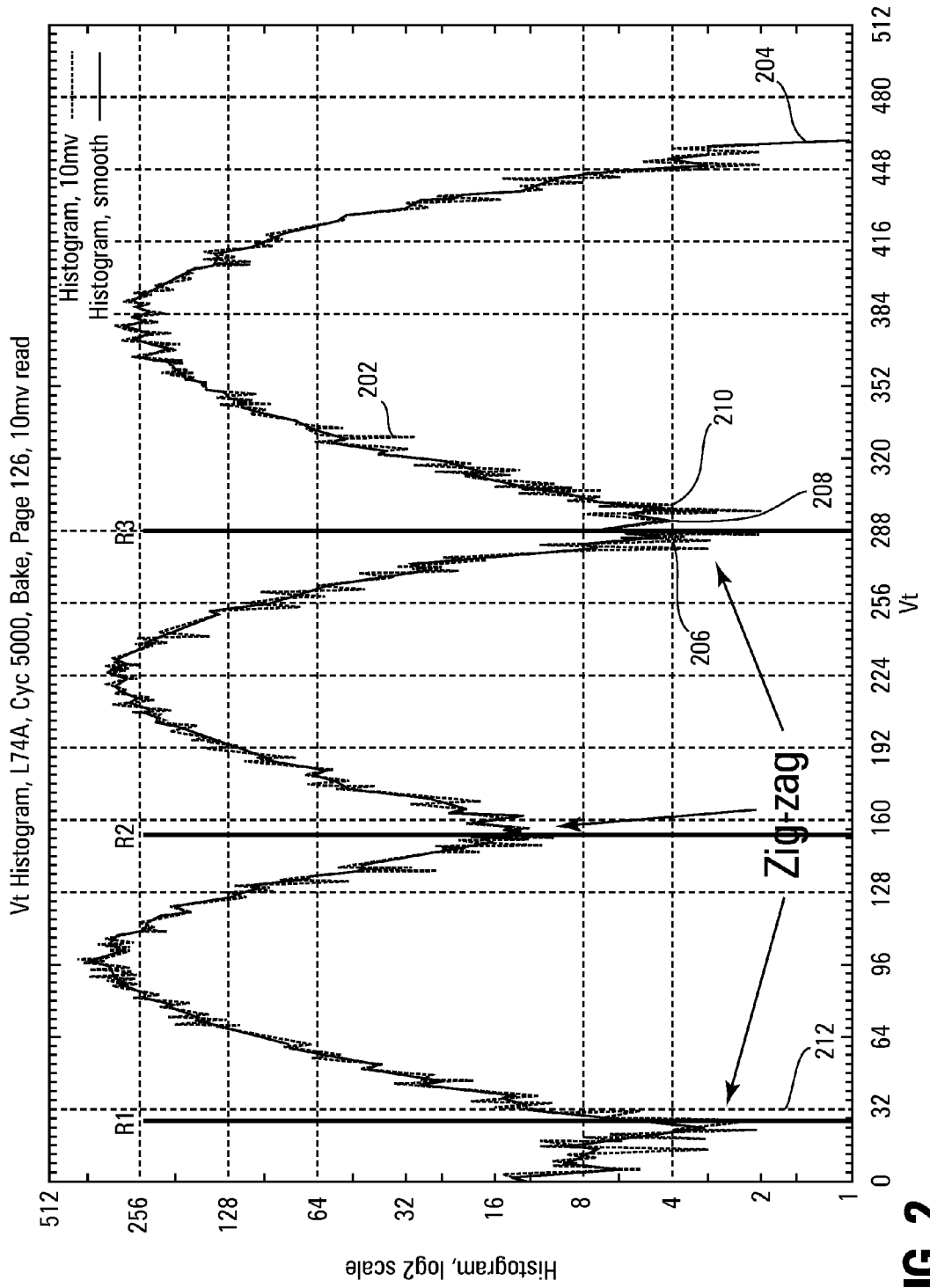
FIG. 2 is a graphic diagram of an embodiment of the present disclosure.

In actual operation of flash memories, instead of building a histogram of all the data in the memory (e.g., which may be a single page of memory or an entire memory device), histograms are built from smaller data samples. FIG. 2 shows a histogram built from 64,000 samples. In day-to-day operation, a smaller number of samples, for example, 2,000 samples, can be used. When the number of samples is reduced, fluctuations in the histogram will increase, creating even more use for filtering to overcome noise and randomness in the data.

In situations where there are truncations, such as in a data state0 distribution where the threshold voltage in the search region between data states is near 0, single side neighbors may be used for filtering the histogram. For example, referring to FIG. 2, around threshold voltage value 32 steps indicated by line 212, no histogram is available for values below Vt=0. Because initial read voltage level R1 could be 0 with a given part, a search range for local minimums of 0 steps to 64 steps may be used instead of −32 steps to 32 steps. Since the range is right at the edge of the known data, there are no left neighbors near Vt=0. To keep the relative metric, adjustment of the initial read voltage level can be accomplished with filtering using right neighbors only, to maintain the same scale in the histograms.

A method of operating a memory in another embodiment comprises creating a histogram of sensed data of the memory, and filtering the histogram using at least one of averaging, weighted averaging, summing, and weighted summing. Averaging and summing have been described in further detail above.

A method of operating a memory in another embodiment comprises determining read voltage levels in valleys between distributions of a histogram of sensed data of the memory, and fine tuning the determined read voltage levels. The operations of filtering and adjusting by applying an offset can be combined, but need not be combined. Fine tuning the determined read voltage levels comprises, in one embodiment, averaging minimums on a left and a right of the determined read voltage levels, and offsetting the read voltage levels when distributions for data states of the memory on either side of the initial read voltage levels have different widths. Valleys may be determined using sigma-weighted calculation of the valleys.

Depending on complexity, the methods described herein may be implemented within an internal controller (e.g., control circuitry) of a memory device, or within an external controller of a memory device. If implemented within an internal controller of a memory device, limited processing power and capacity may limit the complexity of filtering and weighting schemes. If implemented in an external controller, complexity can be increased due to increased computing and processing power.

Figure 3:
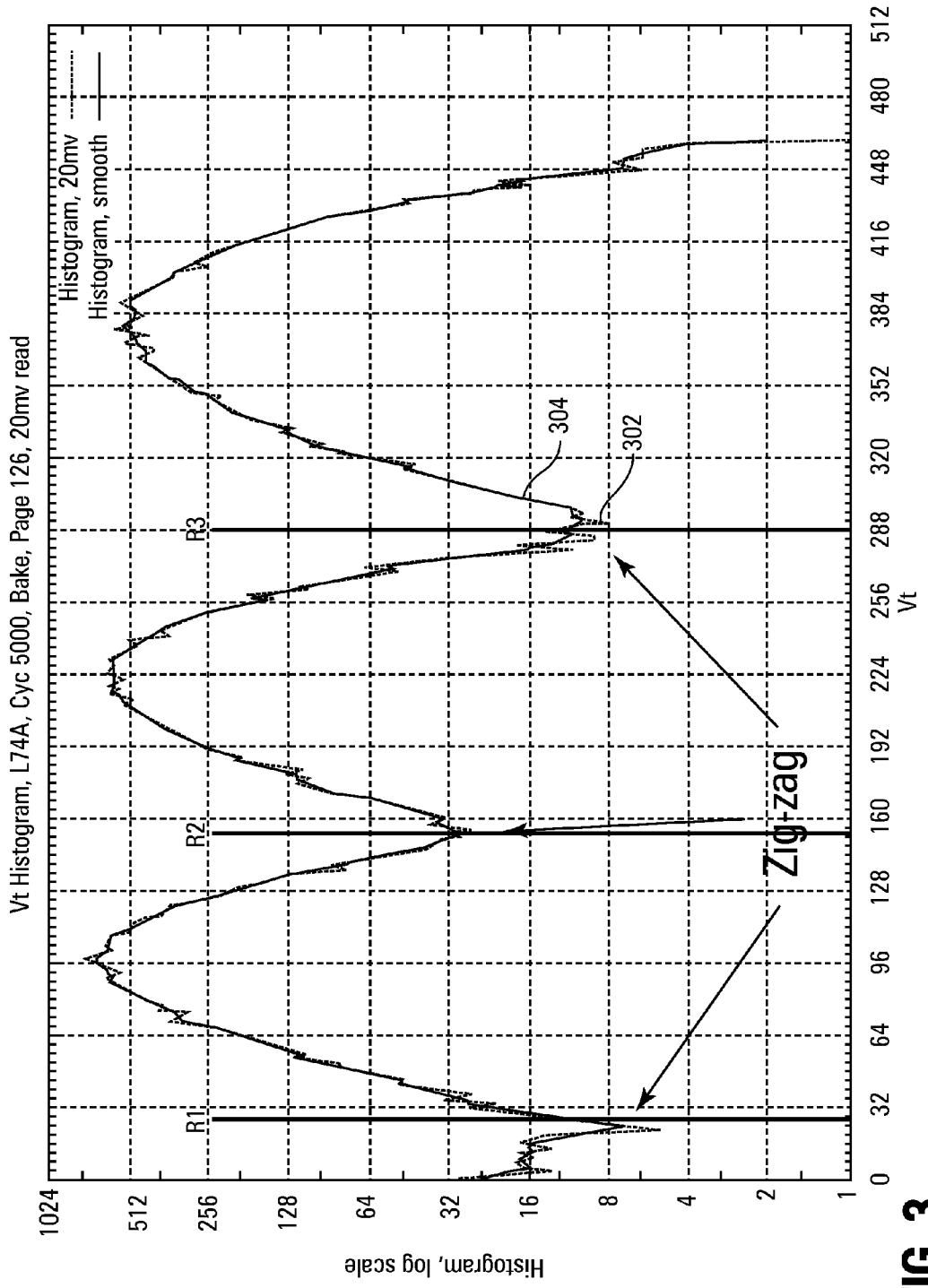
FIG. 3 is a graphic diagram of another embodiment of the present disclosure.

Further adjustments to the filtering embodiments described herein may use the same process with different threshold voltage read increments within the memory. For example, instead of a 10 mV step in read threshold, a 20 mV step may be used. The same process for filtering the histogram may be implemented with different threshold voltage steps to further smooth the histogram. Using a larger threshold voltage read step can make minimums in the filtered histogram easier to determine, which can stabilize the process. A graphic representation of such a histogram and filtered histogram is shown in FIG. 3, with line 302 indicating the initial histogram, and line 304 indicating the filtered histogram.

Figure 4:
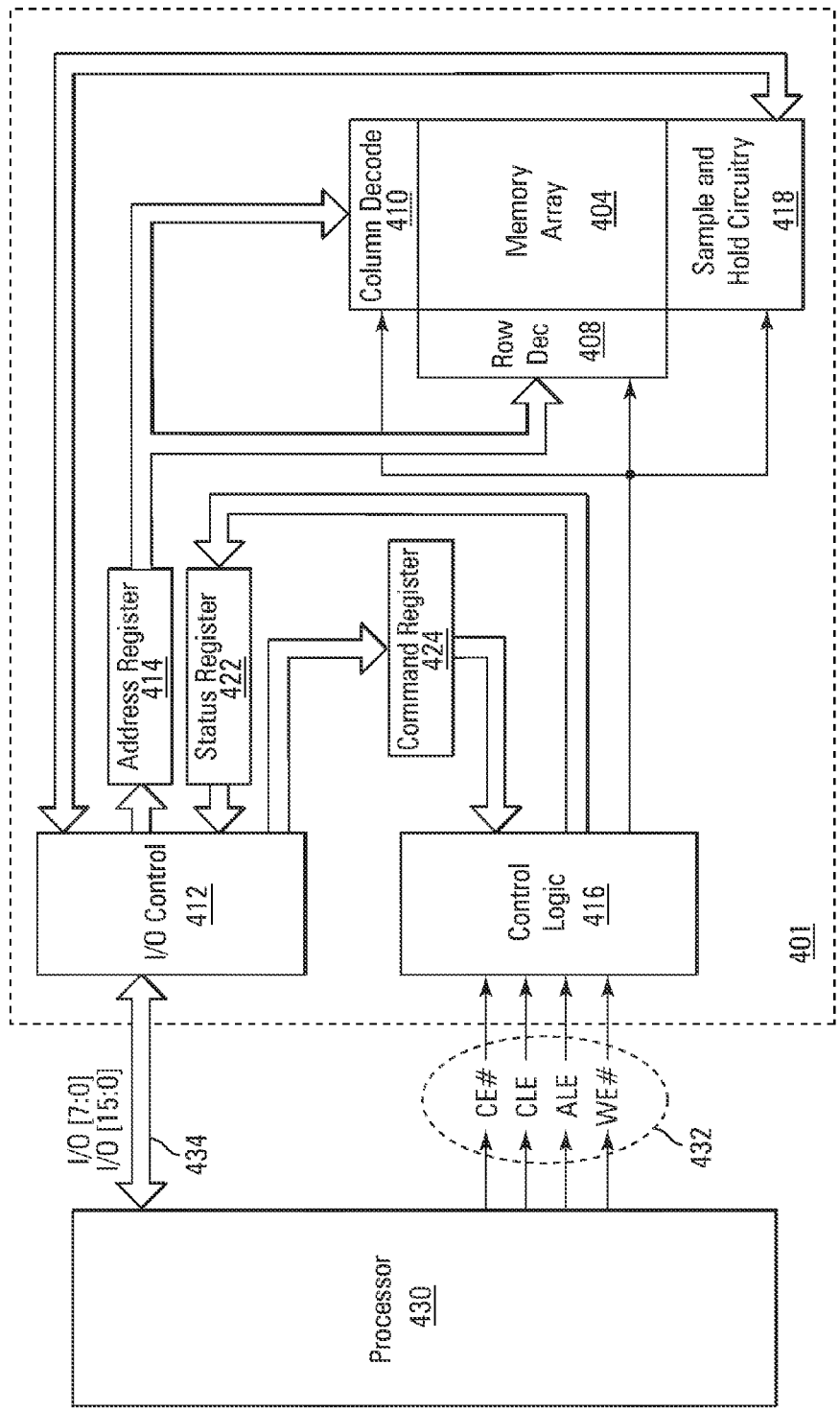
FIG. 4 is a block schematic of an electronic system in accordance with an embodiment of the disclosure.

FIG. 4 is a simplified block diagram of a memory device 401 according to an embodiment of the disclosure, and on which various embodiments of the disclosure can be practiced. Memory device 401 includes an array of memory cells 404 arranged in rows and columns. Although the various embodiments will be described primarily with reference to NAND memory arrays, the various embodiments are not limited to a specific architecture of the memory array 404. Some examples of other array architectures suitable for the present embodiments include NOR arrays, AND arrays, and virtual ground arrays. Further, the embodiments described herein are amenable for use with SLC and MLC memories without departing from the scope of the disclosure. Also, the methods are applicable for memories which could be read/sensed in analog format.

Row decode circuitry 408 and column decode circuitry 410 are provided to decode address signals provided to the memory device 401. Address signals are received and decoded to access memory array 404. Memory device 401 also includes input/output (I/O) control circuitry 412 to manage input of commands, addresses and data to the memory device 401 as well as output of data and status information from the memory device 401. An address register 414 is coupled between I/O control circuitry 412 and row decode circuitry 408 and column decode circuitry 410 to latch the address signals prior to decoding. A command register 424 is coupled between I/O control circuitry 412 and control logic 416 to latch incoming commands. In one embodiment, control logic 416, control circuitry 412 and/or firmware or other circuitry can individually, in combination, or in combination with other elements, form an internal controller. As used herein, however, a controller need not necessarily include any or all of such components. In some embodiments, a controller can comprise an internal controller (e.g., located on the same die as the memory array) and/or an external controller. Control logic 416 controls access to the memory array 404 in response to the commands and generates status information for an external controller such as a processor 430. The control logic 416 is coupled to row decode circuitry 408 and column decode circuitry 410 to control the row decode circuitry 408 and column decode circuitry 410 in response to the addresses.

Control logic 416 can be coupled to a sample and hold circuitry 418. The sample and hold circuitry 418 latches data, either incoming or outgoing, in the form of analog data signals. For example, the sample and hold circuitry could contain capacitors or other analog storage devices for sampling either an incoming data signal representing data to be written to a memory cell or an outgoing data signal indicative of the threshold voltage sensed from a memory cell. The sample and hold circuitry 418 may further provide for amplification and/or buffering of the sampled signal to provide a stronger data signal to an external device.

The handling of analog data signals may take an approach similar to an approach well known in the area of CMOS imager technology, where charge levels generated at pixels of the imager in response to incident illumination are stored on capacitors. These charge levels are then converted to signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a data signal indicative of an actual or target threshold voltage of a memory cell for reading or programming, respectively, the memory cell. This charge could then be converted to an analog data signal using a differential amplifier having a grounded input or other reference signal as a second input. The output of the differential amplifier could then be passed to the I/O control circuitry 412 for output from the memory device, in the case of a read operation, or used for comparison during one or more verify operations in programming the memory device. It is noted that the I/O control circuitry 412 could optionally include analog-to-digital conversion functionality and digital-to-analog conversion (DAC) functionality to convert read data from an analog data signal to a digital bit pattern and to convert write data from a digital bit pattern to an analog signal such that the memory device 401 could be adapted for communication with either an analog or digital data interface.

During a programming operation, target memory cells of the memory array 404 can be programmed until voltages indicative of their threshold voltage levels match the levels held in the sample and hold circuitry 418. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the threshold voltage levels of the target memory cells are passed to the sample and hold circuitry 418 for transfer to an external controller (not shown in FIG. 4) either directly as analog signals or as digitized representations of the analog signals depending upon whether ADC/DAC functionality is provided external to, or within, the memory device.

Threshold voltages of cells may be determined in a variety of manners. For example, a voltage of an access line, such as those typically referred to as word lines, could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 418 may include caching, i.e., multiple storage locations for each data value, such that the memory device 401 may be reading a next data value while passing a first data value to an external controller, or receiving a next data value while writing a first data value to the memory array 404. A status register 422 is coupled between I/O control circuitry 412 and control logic 416 to latch the status information for output to an external controller.

Memory device 401 receives control signals at control logic 416 over a control link 432. The control signals may include a chip enable CE#, a command latch enable CLE, an address latch enable ALE, and a write enable WE#. Memory device 401 may receive commands (in the form of command signals), addresses (in the form of address signals), and data (in the form of data signals) from an external controller over a multiplexed input/output (I/O) bus 434 and output data to an external controller over I/O bus 434.

In a specific example, commands are received over input/output (I/O) pins [7:0] of I/O bus 434 at I/O control circuitry 412 and are written into command register 424. The addresses are received over input/output (I/O) pins [7:0] of bus 434 at I/O control circuitry 412 and are written into address register 414. The data may be received over input/output (I/O) pins [7:0] for a device capable of receiving eight parallel signals, or input/output (I/O) pins [15:0] for a device capable of receiving sixteen parallel signals, at I/O control circuitry 412 and are transferred to sample and hold circuitry 418. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 4 has been simplified to help focus on the embodiments of the disclosure.

Methods for operating a memory may be performed in various embodiments on a memory such as memory 400. Such methods are shown and described herein with reference to FIGS. 1-3.

While FIG. 4 has been described with respect to sample and hold circuitry 418, it should be understood that the control logic 416 could be coupled to data latches instead of sample and hold circuitry 418 without departing from the scope of the disclosure. Data latches data, either incoming or outgoing. During a write operation, target memory cells of the memory array 404 are programmed, for example using two sets of programming pulses as described above, until voltages indicative of their threshold voltage levels match the data held in the data latches. This can be accomplished, as one example, using differential sensing devices to compare the held data to a threshold voltage of the target memory cell.

Additionally, while the memory device of FIG. 4 has been described in accordance with popular conventions for receipt and output of the various signals, it is noted that the various embodiments are not limited by the specific signals and I/O configurations described. For example, command and address signals could be received at inputs separate from those receiving the data signals, or data signals could be transmitted serially over a single I/O line of I/O bus 434. Because the data signals represent bit patterns instead of individual bits, serial communication of an 8-bit data signal could be as efficient as parallel communication of eight signals representing individual bits.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of operating a memory, comprising:
creating a histogram of sensed threshold voltages of the memory;
determining a first threshold voltage corresponding to a highest local minimum in the histogram;
determining a second threshold voltage corresponding to a lowest local minimum in the histogram; and
sensing the memory using a third threshold voltage that is an average of the first threshold voltage and the second threshold voltage.

2. The method of claim 1, further comprising filtering the histogram.

3. The method of claim 2, wherein determining the first threshold voltage level corresponding to the highest local minimum in the histogram comprises determining the first threshold voltage level corresponding to the highest local minimum in the filtered histogram, and wherein determining the second threshold voltage level corresponding to the lowest local minimum in the histogram comprises determining the second threshold voltage level corresponding to the lowest local minimum in the filtered histogram.

4. The method of claim 2, wherein filtering the histogram comprises determining, for each threshold voltage in the histogram, an average of that threshold voltage and one or more threshold voltages surrounding that threshold voltage.

5. The method of claim 1, further comprising applying an offset to the third threshold voltage.

6. The method of claim 5, further comprising reading the offset from a table.

7. The method of claim 1, wherein determining the first threshold voltage level corresponding to the highest local minimum in the histogram and determining the second threshold voltage level corresponding to the lowest local minimum in the histogram comprises determining a local minimum in the histogram that comprises the highest local minimum and the lowest local minimum.

8. The method of claim 1, wherein determining the first threshold voltage level corresponding to the highest local minimum in the histogram and determining the second threshold voltage level corresponding to the lowest local minimum in the histogram comprises determining a region in the histogram between distributions of the sensed threshold voltages that comprises the highest local minimum and the lowest local minimum.

9. The method of claim 8, wherein determining the region in the histogram between the distributions of the sensed threshold voltages that comprises the highest local minimum and the lowest local minimum comprises determining widths of the distributions of the sensed threshold voltages.

10. The method of claim 1, wherein determining the first threshold voltage level corresponding to the highest local minimum in the histogram and determining the second threshold voltage level corresponding to the lowest local minimum in the histogram comprises determining a region in the histogram between data states in the memory that comprises the highest local minimum and the lowest local minimum.

11. A method of operating a memory, comprising:
determining a valley in a histogram of sensed threshold voltages;
determining a first threshold voltage corresponding to a lowest local minimum in the valley;
determining a second threshold voltage corresponding to a highest local minimum in the valley; and
sensing the memory with a third threshold voltage that is an average of the first and second threshold voltages.

12. The method of claim 11, wherein sensing the memory with the third threshold voltage that is the average of the first and second threshold voltages comprises reading the memory with the third threshold voltage that is the average of the first and second threshold voltages.

13. The method of claim 11, further comprising filtering the histogram of the sensed threshold voltages and determining the valley in the filtered histogram of the sensed threshold voltages.

14. The method of claim 11, wherein the valley is between data states in the memory.

15. An apparatus, comprising:
a controller;
wherein the controller is configured to create a histogram of sensed threshold voltages of the memory;
wherein the controller is configured to determine a first threshold voltage corresponding to a highest local minimum in the histogram;
wherein the controller is configured to determine a second threshold voltage corresponding to a lowest local minimum in the histogram; and
wherein the controller is configured to sense the memory using a third threshold voltage that is an average of the first threshold voltage and the second threshold voltage.

16. The apparatus of claim 15, wherein the controller is configured to apply an offset to the third threshold voltage.

17. The apparatus of claim 16, wherein the controller is configured to read the offset from a table.

18. The apparatus of claim 15, wherein the controller being configured to determine the first threshold voltage level corresponding to the highest local minimum in the histogram and to determine the second threshold voltage level corresponding to the lowest local minimum in the histogram comprises the controller being configured to determine a local minimum in the histogram that comprises the highest local minimum and the lowest local minimum.

19. The apparatus of claim 15, wherein the controller is configured to filter the histogram, wherein the controller being configured to determine the first threshold voltage level corresponding to the highest local minimum in the histogram comprises the controller being configured to determine the first threshold voltage level corresponding to the highest local minimum in the filtered histogram, and wherein the controller being configured to determine the second threshold voltage level corresponding to the lowest local minimum in the histogram comprises the controller being configured to determine the second threshold voltage level corresponding to the lowest local minimum in the filtered histogram.

20. The apparatus of claim 15, wherein the first threshold voltage corresponding to the highest local minimum in the histogram and the second threshold voltage corresponding to the lowest local minimum in the histogram are located between between data states in the memory.

* * * * *